(12) United States Patent
Choi et al.

(10) Patent No.: US 8,334,092 B2
(45) Date of Patent: Dec. 18, 2012

(54) PHOTO-SENSITIVE RESIN COMPOSITION AND A PROTECTIVE FILM FOR PRINTED CIRCUIT BOARD HAVING SUPERIOR HEAT RESISTANT AND MECHANICAL PROPERTY

(75) Inventors: Bo-Yun Choi, Daejeon (KR); Byung-Ju Choi, Daejeon (KR); Woo-Jae Jeong, Daejeon (KR); Kwang-Joo Lee, Daejeon (KR); Min-Su Jeong, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 13/164,302

(22) Filed: Jun. 20, 2011

(65) Prior Publication Data

US 2011/0245363 A1    Oct. 6, 2011

Related U.S. Application Data

(63) Continuation of application No. PCT/KR2011/001557, filed on Mar. 7, 2011.

(30) Foreign Application Priority Data

Mar. 8, 2010 (KR) ........................ 10-2010-0020354

(51) Int. Cl.
- *C08L 63/00* (2006.01)
- *C08G 59/00* (2006.01)
- *G03C 1/00* (2006.01)
- *G03F 7/00* (2006.01)

(52) U.S. Cl. ........... 430/280.1; 522/42; 522/43; 522/44; 522/48; 522/64; 522/170; 528/418; 528/419

(58) Field of Classification Search ............... 430/280.1; 522/121, 122, 170, 43, 44, 64, 48, 42, 83; 528/418, 419; 428/209

See application file for complete search history.

(56) References Cited

U.S. PATENT DOCUMENTS

| | | | | |
|---|---|---|---|---|
| 4,628,022 A * | 12/1986 | Ors et al. | ................... | 430/280.1 |
| 5,262,280 A * | 11/1993 | Knudsen et al. | ............. | 430/312 |
| 5,910,394 A * | 6/1999 | Shelnut | ...................... | 430/280.1 |
| 6,136,506 A * | 10/2000 | Hashimoto et al. | ........ | 430/280.1 |
| 2009/0274961 A1 | 11/2009 | Koseki | | |

FOREIGN PATENT DOCUMENTS

| | | |
|---|---|---|
| JP | 06-230571 A | 8/1994 |
| JP | 2007-310380 A | 11/2007 |
| JP | 2008-189803 A | 8/2008 |
| JP | 2008-250305 A | 10/2008 |
| KR | 1020080029341 A | 4/2008 |
| WO | 01/55790 A1 | 8/2001 |

OTHER PUBLICATIONS

International Search Report for PCT/KR2011/001557 issued Nov. 21, 2011 (3 pages).

* cited by examiner

*Primary Examiner* — Susan W Berman
(74) *Attorney, Agent, or Firm* — Rothwell, Figg, Ernst & Manbeck, P.C.

(57) ABSTRACT

The present invention relates to a photo-sensitive resin composition having superior heat-resistant and mechanical property, and a protective film for printed circuit board, and particularly provides a photo-sensitive resin composition including an acid-modified oligomer, a photo-polymerizable monomer, a photo-initiator, an epoxy resin, and a butadiene-modified epoxy resin including epoxy group and at least one double bond in the main chain, and a protective film for printed circuit board prepared by using the composition.

17 Claims, No Drawings

PHOTO-SENSITIVE RESIN COMPOSITION AND A PROTECTIVE FILM FOR PRINTED CIRCUIT BOARD HAVING SUPERIOR HEAT RESISTANT AND MECHANICAL PROPERTY

The present application is a continuation of PCT International Application No. PCT/KR2011/001557, with an International Filing Date of Mar. 7, 2011, which claims the benefit of Korean patent application no. 10-2010-0020354 filed in the Korean Intellectual Property Office on Mar. 8, 2010, the entire contents of which are incorporated herein by reference.

BACKGROUND OF THE INVENTION (a) Field of the Invention

The present invention relates to a photo-sensitive resin composition and a protective film for printed circuit board, particularly to a photo-sensitive resin composition and a protective film for printed circuit board having superior heat resistant and mechanical property.

(b) Description of the Related Art

As electronic devices are miniaturized and become lightweight, a photo-sensitive protective film which can form minute open patterns is being used in a printed circuit board (hereinafter PCB), a semiconductor package board, a flexible printed circuit board (FPCB), and the like.

The protective film is also called 'solder resist', and the characteristics of developing property, high resolution, insulating property, resistance to soldering heat, tolerance to gold plating, and the like are required. Particularly, for example, a crack-resistant property against a temperature cycle test (TCT) from 55° C. to 125° C., or highly accelerated stress test (HAST) property to fine wirings, in addition to said characteristics are required to the solder resist for package board.

Recently, a Dry Film Solder Resist (DFSR) superior in uniformity of film thickness, surface smoothness, and thin-film-forming property receives attention as the solder resist. Such DFSR can give the effects of simplification of resist-forming process, or reduction of solvent displacement in the resist-forming process, in addition to said characteristics.

The protective film for PCB must satisfy various properties such as high thermal stability, mechanical property, chemical resistance, hygroscopic property, and the like.

Generally, if the composition has a recipe for improving the mechanical property, the heat-resistant falls down, and if the composition has a recipe for improving the heat-resistant, the mechanical property falls down, and thus it has been demanded to develop the composition superior in both of the mechanical property and the heat-resistant.

Japanese Patent Publication No. 2008-189803 discloses a photo-curable and thermo-curable resin composition comprising (A) a carboxyl-containing photo-sensitive resin obtained by reacting a polybasic acid anhydride (c) on a reaction product of a polynuclear epoxy compound (a) and an unsaturated group-containing monocarboxylic acid (b), (B) a carboxyl-containing urethane (meth)acrylate compound, (C) a photo-polymerization initiator, (D) a thermosetting component having two or more cyclic ether groups and/or cyclic thioether groups in one molecule, and (E) a diluent.

Japanese Patent Publication No. 2007-310380 discloses a photo-sensitive resin composition comprising (a) a binder polymer having carboxyl groups, (b) a photo-polymerizable monomer having at least one ethylenically unsaturated group, (c) a polyurethane compound, and (d) a photo-polymerization initiator, wherein the polyurethane compound (c) is obtained by reacting an epoxy acrylate compound having two or more hydroxyl groups and an ethylenically unsaturated group with a diisocyanate compound and a diol compound having a carboxyl group.

Japanese Patent Publication No. 2008-250305 discloses a solder resist containing an acid-modified vinyl ester which is synthesized from an epoxy compound, a phenol compound, an unsaturated monobasic acid, and a polybasic acid anhydride, while using a crystalline epoxy resin having a melting point of 90° C. or more as at least a part of the epoxy compound and using a compound having a bisphenol S skeleton as at least a part of the phenol compound.

However, said methods still do not satisfy the heat-resistant and the mechanical property at the same time, and it is required to develop new technology.

SUMMARY OF THE INVENTION

It is an object of the present invention to provide a photo-sensitive resin composition and a protective film for PCB superior in both of the heat-resistant and the mechanical property.

DETAILED DESCRIPTION OF THE EMBODIMENTS

In order to attain the object, the present invention provides a photo-sensitive resin composition, comprising: an acid-modified oligomer, a photo-polymerizable monomer, a photo-initiator, an epoxy resin and a butadiene-modified epoxy resin including epoxy group and at least one double bond in the main chain.

In the present invention, the butadiene-modified epoxy resin including epoxy group and at least one double bond in the main chain may be the compound represented by the following Chemical Formula 1:

[Chemical Formula 1]

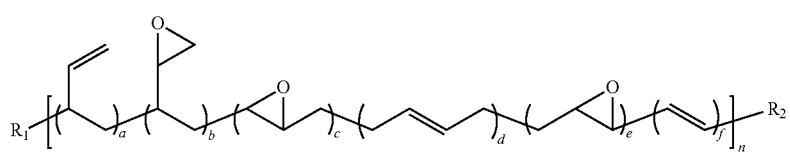

wherein, $R_1$ and $R_2$ are respectively a $C_{1-5}$ alkyl group, a $C_{1-5}$ alkoxy group, cyclopentyl group, cyclohexyl group, a $C_{6-30}$ aryl group, a $C_{6-30}$ alkyl aryl group, or a halogen atom;

a, b, c, d, e, and f are respectively an integer of 0 to 5, and a+b+c+d+e+f is 20 or less, wherein at least one of c and e is not 0, at least one of d and f is not 0; and n is an integer of 1 to 50.

Furthermore, the butadiene-modified epoxy resin represented by Chemical Formula 1 may be the compound represented by the following Chemical Formula 2:

[Chemical Formula 2]

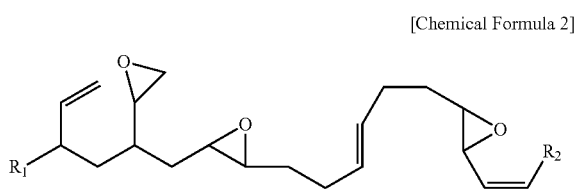

wherein, $R_1$ and $R_2$ are respectively a $C_{1-5}$ alkyl group, a $C_{1-5}$ alkoxy group, cyclopentyl group, cyclohexyl group, a $C_{6-30}$ aryl group, a $C_{6-30}$ alkyl aryl group, or a halogen atom.

Preferably, $R_1$ and $R_2$ are independently a $C_{1-5}$ alkyl group, a $C_{1-5}$ alkoxy group, cyclopentyl group, cyclohexyl group, a $C_{6-14}$ aryl group, a $C_{6-14}$ alkyl aryl group, or a halogen atom.

More preferably, $R_1$ and $R_2$ are independently a $C_{1-5}$ alkyl group, a $C_{1-5}$ alkoxy group, cyclopentyl group, cyclohexyl group, a $C_{6-10}$ aryl group, a $C_{6-10}$ alkyl aryl group, or a halogen atom.

The butadiene-modified epoxy resin represented by Chemical Formula 1 is an epoxidized polybutadiene, and it takes a role of improving the heat-resistant, particularly the mechanical property such as modulus, due to the butadiene part.

The butadiene-modified epoxy resin may have an epoxy equivalent of about 100 to 400, an acid value of about 1 mgKOH/g or less, and a number average molecular weight of about 1,000 to 10,000.

The content of the butadiene-modified epoxy resin may be 1 to 20 weight % based on the total weight of the photo-sensitive resin composition.

The acid-modified oligomer may be at least one selected from the compounds obtained by polymerizing a polymerizable monomer having carboxyl group with methyl methacrylate, methyl acrylate, or ethyl acrylate.

The photo-sensitive resin composition may further comprise at least one selected from the group consisting of an epoxy hardener, an epoxy catalyst, a filler, a pigment, a leveling agent, a dispersing agent and a solvent.

Furthermore, the present invention provides a protective film for PCB, prepared by using the photo-sensitive resin composition disclosed above.

Hereinafter, the present invention is explained in more detail.

The present invention is characterized in that the photo-sensitive resin composition comprises the butadiene-modified epoxy resin including epoxy group and at least one double bond in the main chain as an additive for improving the heat-resistant and the mechanical property.

Said 'photo-sensitive resin composition' means a photo-curable and thermo-curable resin, in the present invention.

According to a preferable embodiment of the present invention, a photo-sensitive resin composition, comprising an acid-modified oligomer, a photo-polymerizable monomer, a photo-initiator, an epoxy resin, and a butadiene-modified epoxy resin including epoxy group and at least one double bond in the main chain is provided.

Furthermore, the photo-sensitive resin composition of the present invention may further comprise at least one selected from the group consisting of an epoxy hardener, an epoxy catalyst, a filler, a pigment, a leveling agent, a dispersing agent, and a solvent, as occasion demands.

The present invention improves the mechanical property largely without deteriorating the heat-resistant reliability by using the butadiene-modified epoxy resin including epoxy group and at least one double bond in the main chain, in the resin composition including an epoxy resin and an acrylate resin having high heat-resistant. Furthermore, the present invention can improve even the cracks and the hole-shape brokenness on the surface of the dry solder resist. Therefore, the film prepared by using the photo-sensitive resin composition according to the present invention shows better elongation at break than to prior films.

Then, each component comprised in the photo-sensitive resin composition of the present invention, and the protective film for printed circuit board prepared by using the same are explained in more detail.

Butadiene-Modified Epoxy Resin

The butadiene-modified epoxy resin used in the present invention includes epoxy groups not at its terminal ends but in the main chain, and further includes at least one double bonds, the butadiene part improves the heat-resistant of the dry film and particularly takes a role of improving the mechanical property such as modulus. Particularly, because the butadiene-modified epoxy resin includes epoxy groups in the main chain, it can show advantageous effect in the heat-resistant in comparison with common butadiene-modified epoxy resins having epoxy groups just at the terminal ends. Namely, when the butadiene-modified epoxy resin has epoxy groups in the main chain, it is easy to bond to the other binder resins, and its heat-resistant reliability is better than the butadiene resin without including epoxy groups in the main chain. Such butadiene-modified epoxy resin may be the compound represented by the Following Chemical Formula 1:

[Chemical Formula 1]

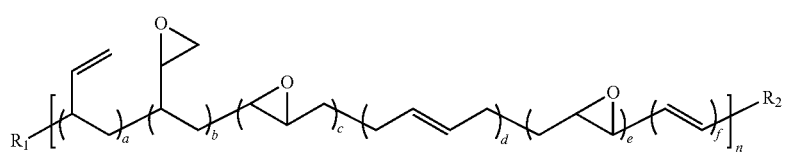

wherein, $R_1$ and $R_2$ are respectively a $C_{1-5}$ alkyl group, a $C_{1-5}$ alkoxy group, cyclopentyl group, cyclohexyl group, a $C_{6-30}$ aryl group, a $C_{6-30}$ alkyl aryl group, or a halogen atom;

a, b, c, d, e, and f are respectively an integer of 0 to 5, and a+b+c+d+e+f is 20 or less, wherein at least one of c and e is not 0, at least one of d and f is not 0; and n is an integer of 1 to 50.

Furthermore, it is preferable that the butadiene-modified epoxy resin of Chemical Formula 1 is the compound represented by the following Chemical Formula 2:

[Chemical Formula 2]

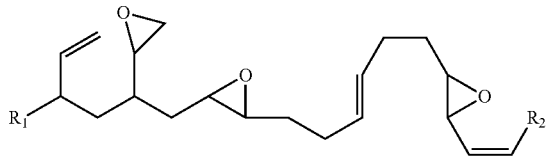

wherein, $R_1$ and $R_2$ are respectively a $C_{1-5}$ alkyl group, a $C_{1-5}$ alkoxy group, cyclopentyl group, cyclohexyl group, a $C_{6-30}$ aryl group, a $C_{6-30}$ alkyl aryl group, or a halogen atom.

The butadiene-modified epoxy resin of Chemical Formula 1 means an epoxidized polybutadiene.

Preferably, in Chemical Formulae 1 and 2, $R_1$ and $R_2$ are independently a $C_{1-5}$ alkyl group, a $C_{1-5}$ alkoxy group, cyclopentyl group, cyclohexyl group, a $C_{6-14}$ aryl group, a $C_{6-14}$ alkyl aryl group, or a halogen atom.

More preferably, in Chemical Formulae 1 and 2, $R_1$ and $R_2$ are independently a $C_{1-5}$ alkyl group, a $C_{1-5}$ alkoxy group, cyclopentyl group, cyclohexyl group, a $C_{6-10}$ aryl group, a $C_{6-10}$ alkyl aryl group, or a halogen atom.

The butadiene-modified epoxy resin having such characteristics may have an epoxy equivalent of about 100 to 400, an acid value of about 1 mgKOH/g or less, and a number average molecular weight of about 1,000 to 10,000. Also preferably, the butadiene-modified epoxy resin may have a number average molecular weight of about 2,000 to 8,000.

As the butadiene-modified epoxy resin, a commercialized product may be used, for example, EPOLEAD PB 3600 (Japan Daicel Chemical Industries, Ltd.) may be used. The specifications of EPOLEAD PB 3600 are listed in the following Table 1.

TABLE 1

| | |
|---|---|
| Color (APHA) | <150 |
| Acid value (mgKOH/g) | <1 |
| Epoxy equivalent | 184-213 |
| Viscosity (mPa · s/45° C.) | 20,000-70,000 |
| Number average molecular weight (Mn) | 5900 |
| Specific gravity (g/mL) | 0.99 |
| Flashing point (° C.) | 283 |

EPOLEAD PB 3600 is an epoxidized polybutadiene having both of epoxy group and vinyl group in the main chain of the molecule, and its epoxy equivalent is lower than common epoxidized polybutadienes without epoxy group in the main chain. Therefore, said material is superior in miscibility to the epoxy resins of bisphenol A-type or cresol novolak-type. Furthermore, the epoxidized polybutadiene can make a hardened product having superior flexibility by using a phenyl resin as a hardener, and when an acid anhydride is used as a hardener, the hardened product can have superior transparency and low stress.

A butadiene-modified epoxy resin (polybutadiene, epoxy functionalized, hydroxy terminated, product No. 387673) of Sigma-Aldrich Co., Ltd. also may be used in the present invention. The specifications of the material are listed in the following Table 2.

TABLE 2

| | |
|---|---|
| Color (APHA) | <150 |
| Acid value (mgKOH/g) | <1 |
| Epoxy equivalent | 100~300 |
| Viscosity (mPa · s/45 ° C.) | 3,000~50,000 |
| Number average molecular weight (Mn) | ~1,300 |
| Specific gravity (g/mL, 25° C.) | 1.01 |
| Flashing point (° C.) | >113 |

The content of the butadiene-modified epoxy resin including epoxy group and at least one double bond in the main chain may be about 1 to 20 weight % based on the total weight of the photo-sensitive resin composition, preferably 3 to 15 weight %, and more preferably about 5 to 10 weight %. Here, when the content of butadiene-modified epoxy resin is below about 1 weight %, the mechanical properties may not be improved, and when the content of butadiene-modified epoxy resin is over about 20 weight %, the mechanical properties may be improved but the heat-resistant may fall down.

Acid-Modified Oligomer

The acid-modified oligomer is an oligomer including carboxyl group and vinyl group, and the main chain of the oligomer may be a novolak epoxy or polyurethane. The carboxyl group included in the acid-modified oligomer can be dissolved in an alkali-solution and make it possible to alkali-develop, and thermally hardened with epoxy groups. Furthermore, the vinyl group included in the acid-modified oligomer is a structure capable of radical photo-polymerization.

As the acid-modified oligomer, a compound obtained by polymerizing a polymerizable monomer having carboxyl group with methyl methacrylate, methyl acrylate, ethyl acrylate, and the like.

Specifically, the compounds disclosed below may be used as the acid-modified oligomer.

(1) A resin containing carboxyl group, obtained by copolymerizing an unsaturated carboxylic acid a such as (meth)acrylic acid and the like, and a compound b having unsaturated double bond such as styrene, α-methyl styrene, lower alkyl(meth)acrylate, iso-butylene, and the like.

(2) A photo-sensitive resin containing carboxyl group, obtained by reacting a compound having an ethylenically unsaturated group such as vinyl group, allyl group, (meth)acryloyl group, and the like, and a reacting group such as epoxy group, acid chloride, and the like, for example glycidyl (meth)acrylate, with the part of the copolymer of the unsaturated carboxylic acid a and the compound b having unsaturated double bond, and further adding an ethylenically unsaturated group thereto as a pendant group.

(3) A photo-sensitive resin containing carboxyl group, obtained by reacting the unsaturated carboxylic acid a with the copolymer of a compound c having an epoxy group and an unsaturated double bond such as glycidyl (meth)acrylate, α-methylglycidyl (meth)acrylate, and the like, and the compound b having unsaturated double bond, and further reacting a saturated or unsaturated polybasic acid anhydride d such as phthalic anhydride, tetrahydrophthalic anhydride, hexahydrophthalic anhydride, and the like, with the secondary hydroxyl group formed by prior reaction.

(4) A photo-sensitive resin containing carboxyl group, obtained by reacting a compound f having one hydroxyl group and at least one ethylenically unsaturated double bond such as hydroxyalkyl (meth)acrylate and the like with the copolymer of an acid anhydride e having unsaturated double bond such as maleic anhydride, itaconic anhydride, and the like and the compound b having unsaturated double bond.

(5) A photo-sensitive compound containing carboxyl group, obtained by carrying out esterification reaction (whole esterification or partial esterification, preferably whole esterification) between epoxy groups of a multifunctional epoxy compound g having two or more epoxy groups in the molecule or a multifunctional epoxy resin obtained by epoxidating hydroxyl group of the multifunctional epoxy compound with epichlorohydrin in addition, and carboxylic groups of a unsaturated monocarboxylic acid h such as (meth)acrylic acid and the like, and further reacting the saturated or unsaturated polybasic acid anhydride d with the hydroxyl group formed by prior reaction.

(6) A resin containing carboxyl group, obtained by reacting an organic acid i having one carboxylic acid in one molecule without an ethylenically unsaturated bond such as a $C_{2-17}$ alkyl carboxylic acid, an alkyl carboxylic acid containing aromatic group, and the like with the epoxy group of copolymer of the compound b having unsaturated double bond and glycidyl(meth)acrylate, and further reacting the saturated or unsaturated polybasic acid anhydride d with the secondary hydroxyl group formed by prior reaction.

(7) An urethane resin containing carboxyl group, obtained by reacting a diisocyanate j such as an aliphatic diisocyanate, a branched aliphatic diisocyanate, an alicyclic diisocyanate, an aromatic diisocyanate, and the like, a dialcohol compound k including carboxyl group such as dimethylol propionic acid, dimethylol butanoic acid, and the like, and the middle part of diol compound m such as a polycarbonate-based polyol, a polyether-based polyol, a polyester-based polyol, a polyolefin-based polyol, acryl-based polyol, bisphenol A type alkyleneoxide adduct diol, a compound having phenolic hydroxyl group and alcoholic hydroxyl group, and the like.

(8) A photo-sensitive urethane resin containing carboxyl group, obtained by reacting the diisocyanate j, a (meth)acrylate or a partial acid anhydride-modified compound n of a bi-functional epoxy resin such as a bisphenol A-type epoxy resin, a hydrogenated bisphenol A-type epoxy resin, a brominated bisphenol A-type epoxy resin, a bisphenol F-type epoxy resin, a bisphenol S-type epoxy resin, a bixylenol-type epoxy resin, a biphenol-type epoxy resin, and the like, the dialcohol compound k including carboxyl group, and the middle part of the diol compound m.

(9) An urethane resin containing carboxyl group, obtained by adding the compound f having one hydroxyl group and at least one ethylenically unsaturated double bond such as hydroxyalkyl(meth)acrylate and the like so as to introduce an unsaturated double bond to the terminal ends, in the reaction process of said (7) or (8).

(10) An urethane resin containing carboxyl group, obtained by adding a compound including one isocyanate group and one or more (meth)acryloyl group to the molecule prepared by an equimolar reaction of isophorone diisocyanate and pentaerythritol triacrylate, and (meth)acrylating the terminal ends, during the reaction process of said (7) or (8).

(11) A photo-sensitive resin containing carboxyl group, obtained by reacting the saturated or unsaturated polybasic acid anhydride d with the primary hydroxyl group of a modified oxetane compound obtained by reacting the unsaturated monocarboxylic acid h with a multi-functional oxetane compound having 2 or more oxetane rings in the molecule.

(12) A polyester resin containing carboxyl group, obtained by adding the saturated or unsaturated polybasic acid anhydride d to the primary hydroxyl group formed by reacting dicarboxylic acid with a bi-functional epoxy resin or a bi-functional oxetane resin.

(13) A photo-sensitive resin containing carboxyl group, obtained by introducing an unsaturated double bond to the reaction product of a bisepoxy compound and a bisphenol compound, and successively reacting the saturated or unsaturated polybasic acid anhydride d with the same.

(14) A photo-sensitive resin containing carboxyl group, obtained by reacting the saturated or unsaturated polybasic acid anhydride d with the reaction product obtained by reacting the unsaturated monocarboxylic acid h with the reaction product of a novolak-type phenol resin, and an alkyleneoxide such as ethyleneoxide, propyleneoxide, butyleneoxide, trimethyleneoxide, tetrahydrofuran, tetrahydropyran, and the like and/or a cyclic carbonate such as ethylenecarbonate, propylenecarbonate, butylenecarbonate, 2,3-carbonate propylmethacrylate, and the like.

Here, it is preferable in the point of flexibility that the acid-modified oligomer corresponds to (i) the case of that the compounds having an isocyanate group (diisocyanate is included also) used for synthesizing the resins of (7) to (10) do not include a benzene ring, and (ii) the case of that the multi-functional and the bi-functional epoxy resins used for synthesizing the resins of (5), (8), and (12) are linear compounds having bisphenol A backbone, bisphenol F backbone, biphenyl backbone, and bixylenol backbone, or hydrogenated compounds thereof, among said resins containing carboxyl group. Furthermore, among said acid-modified oligomer, the resins of (7) to (10), and the modified compounds thereof as in (12) have urethane bond in their main chain, and may be preferably used in the point of bending. Furthermore, the resins besides (1), (6), (7), (11), and (12) have a photo-sensitive group including a radical polymerizable unsaturated double bond in the molecules, and thus they may be preferably used in the point of the photo-curing property. Furthermore, the acid-modified oligomer CCR-1235 (Nippon Kayaku Co., Ltd.) on sale and the like may be used.

The content of the acid-modified oligomer may be in the range of about 15 to 75 weight % based on the total weight of the photo-sensitive resin composition, preferably about 25 to 65 weight %, and more preferably about 30 to 50 weight %. When the content of the acid-modified oligomer is below about 15 weight %, the developing property falls down and strength of the film deteriorates, and when the content exceeds about 75 weight %, the composition is excessively developed and the uniformity during coating falls down.

The acid value of the acid-modified oligomer may be about 40 to 120 mgKOH/g, preferably about 45 to 115 mgKOH/g, and more preferably about 50 to 110 mgKOH/g. When the acid value of the acid-modified oligomer is below about 40 mgKOH/g, the alkali developing gets difficult, and when it exceeds about 120 mgKOH/g, it is difficult to form a normal resist pattern because the exposed line becomes thinner unnecessarily or the exposed part and the unexposed part are dissolved and exfoliated by the developing solution without distinction, since the exposure part dissolves in the developing solution.

Photo-Polymerizable Monomer

The photo-polymerizable monomer has three or more multi-functional vinyl groups and takes a role of cross-linking during the photo-polymerization. The purpose of using the photo-polymerizable monomer is to give the composition the photo-curing property. The photo-polymerizable monomer which is liquid phase in room temperature may be used, such liquid photo-polymerizable monomer takes roles of controlling the viscosity of the composition suitable for various coating methods or enhancing solubility in an aqueous alkali solution, in addition to the purpose of giving the photo-sensitive composition the photo-curing property.

The photo-polymerizable monomer may be acrylates including hydroxyl groups such as 2-hydroxyethyl acrylate, 2-hydroxypropyl acrylate, pentaerythritol triacrylate, dipentaerythritol pentaacrylate, and the like; water soluble acrylates such as polyethyleneglycol diacrylate, polypropyleneglycol diacrylate, and the like; multi-functional polyester acrylates of polyhydric alcohol such as trimethylolpropane triacrylate, pentaerythritol tetraacrylate, dipentaerythritol hexaacrylate, and the like; acrylates of ethyleneoxide adducts and/or propyleneoxide adducts of polyfunctional alcohols such as trimethylol propane, hydrogenated bisphenol A, and the like, or polyphenols such as bisphenol A, biphenyl, and the like; polyfunctional or monofunctional polyurethane acrylates which are isocyanate-modified compounds of said acrylates including hydroxyl group; epoxy acrylates which are (meth)acrylic acid adducts of bisphenol A diglycidyl ether, hydrogenated bisphenol A diglycidyl ether, or phenol novolak epoxy resin; and photo-sensitive (meth)acrylate compounds of caprolactone-modified acrylates such as caprolactone-modified ditrimethylolpropane tetraacrylate, ε-caproactone-modified dipentaerythritol acrylate, caprolactone-modified hydroxypivalic acid neopentylglycol ester diacrylate, and the like, and methacrylates corresponding to said acrylates. Said compounds may be used solely or by mixing two or more.

Among these compounds, the polyfunctional (meth)acrylate compounds having two or more (meth)acryloyl groups in one molecule is preferably used as the photo-polymerizable monomer, specifically, pentaerythritol triacrylate, trimethylolpropane triacrylate, dipentaerythritol hexaacrylate, caprolactone-modified ditrimethylolpropane tetraacrylate, and the like are preferable. The photo-polymerizable monomer may be used by mixing each other. Furthermore, the photo-polymerizable monomer DPEA-12 (Kayarad Co., Ltd.) on sale and the like may be used.

The content of the photo-polymerizable monomer may be about 5 to 30 weight % based on the total weight of the photo-sensitive resin composition, preferably about 7 to 25 weight %, and more preferably about 10 to 20 weight %. When the content of the photo-polymerizable monomer is below 5 weight %, the photo-curing is not sufficient, and when the content exceeds about 30 weight %, the drying property gets bad and the properties of film gets also bad.

Photo-Initiator

The photo-initiator takes a role of initiating the radical photo-curing.

As the photo-initiator, benzoin, benzoin methyl ether, benzoin ethyl ether, acetophenone, 2,2-dimethoxy-2-phenyl acetophenone, 2,2-diethoxy-2-phenyl acetophenone, 2-methyl anthraquinone, 2-ethyl anthraquinone, 2,4,6-trimethylbenzoyldiphenyl phosphine oxide (TPO), and the like may be used, and these may be used solely, or by mixing two or more.

The content of the photo-initiator may be about 0.1 to 10 weight % based on the total weight of the photo-sensitive resin composition, and preferably about 1 to 5 weight %. When the photo-initiator is used below about 0.1 weight %, the polymerization is insufficient due to lack of the content, and when it is used over about 10 weight %, the resolution deteriorates and the reliability may also be insufficient.

Epoxy Resin

The epoxy resin has one or more polyfunctional epoxy group, and is thermally cured with the acid-modified oligomer or the epoxy hardener. The softening point of the epoxy resin should be 70 to 100° C. to minimize the unevenness during lamination, when the softening point is low, tackiness of the film increases, and when it is high, the flowability becomes bad. Therefore, the softening point of the epoxy resin should be in the range of the present invention, so as to exhibit superior properties.

As the epoxy resin, a bisphenol A-type epoxy resin, a hydrogenated bisphenol A-type epoxy resin, a brominated bisphenol A-type epoxy resin, a bisphenol F-type epoxy resin, a bisphenol S-type epoxy resin, a novolak-type epoxy resin, a phenol novolak-type epoxy resin, a cresol novolak-type epoxy resin, N-glycidyl-type epoxy resin, a novolak-type epoxy resin of bisphenol A, a bixylenol-type epoxy resin, a biphenol-type epoxy resin, a chelate-type epoxy resin, a glyoxal-type epoxy resin, an epoxy resin including amino groups, a rubber-modified epoxy resin, a dicyclopentadiene phenolic-type epoxy resin, diglycidyl phthalate resin, a heterocyclic epoxy resin, a tetraglycidyl xylenoyl ethane resin, a silicone-modified epoxy resin, and a ε-caprolatone-modified epoxy resin, and the like may be used. Furthermore, the commercialized epoxy resin EOCN-1020 (Nippon Kayaku Co., Ltd.) and the like may be used.

The content of the epoxy resin may be about 5 to 30 weight % based on the total weight of the photo-sensitive resin composition, preferably about 7 to 25 weight %, and more preferably about 10 to 20 weight %. When the content of the epoxy resin is below about 5 weight %, the mechanical property of the film falls down, and when the content is over about 30 weight %, the developing property falls down.

Epoxy Hardener

The epoxy hardener takes a role of curing the epoxy resin during thermal curing process.

As the epoxy hardener, amine-based compounds, acid anhydride-based compounds, amide-based compounds, phenol-based compounds, and the like may be used. As the amine-based compounds, diaminodiphenyl methane, diethylene triamine, triethylene tetraamine, diaminodiphenyl sulfone, isophorone diamine, and the like may be used. As the acid anhydride-based compounds, phthalic anhydride, trimellitic anhydride, pyromellitic anhydride, maleic anhydride, tetrahydrophthalic anhydride, methyltetrahydrophthalic anhydride, methylnadic anhydride, hexahydrophthalic anhydride, methylhexahydrophthalic anhydride, and the like may be used. As the amide-based compounds, dicyandiamide, polyamide resin synthesized from linolenic acid dimmer and ethylene diamine, and the like may be used. As the phenol-based compounds, polyphenols such as bisphenol A, bisphenol F, bisphenol S, fluorene bisphenol, terpene diphenol, and the like; phenol resins obtained by condensation reaction of phenols with aldehydes, ketones, dienes, and the like; phenol resins obtained by polycondensation of phenols with substituted biphenyls, substituted phenyls, and the like; modified compounds of phenols and/or phenol resins; halogenated phenols such as tetrabromo bisphenol A, a brominated phenol resin, and the like; and imidazoles, BF3-amine complex, guanidine derivatives, and the like may be used.

The content of the epoxy hardener may be about 0.01 to 15 weight % based on the total weight of the photo-sensitive resin composition, and preferably about 0.05 to 10 weight %. When the content of the epoxy hardener is below about 0.01 weight %, the epoxy resin is cured insufficiently, and when the content is over about 15 weight %, there is a problem of poor developing property.

Epoxy Catalyst

The epoxy catalyst takes a role of accelerating the curing of the epoxy resin during thermal curing process.

As the epoxy catalyst, imidazole derivatives such as imidazole, 2-methyl imidazole (2MI), 2-ethyl imidazole, 2-ethyl-4-methyl imidazole, 2-phenyl imidazole, 4-phenyl imidazole, 1-cyanoethyl-2-phenyl imidazole, 1-(2-cyanoethyl)-2-ethyl-4-methyl imidazole, and the like; amine compounds such as dicyandiamide, benzyldimethyl amine, 4-(dimethylamino)-N,N-dimethylbenzyl amine, 4-methoxy- N,N-dimethylbenzyl amine, 4-methyl-N,N-dimethylbenzyl amine, and the like; hydrazine compounds such as adipic acid dihydrazide, sebacic acid dihydrazide, and the like; and phosphine compounds such as triphenyl phosphine and the like may be used. Furthermore, as the catalysts on sale, there are 2MZ-A, 2MZ-OK, 2PHZ, 2P4BHZ, and 2P4 MHZ (product names of imidazole-based compounds) produced by Sikoku Kasei kogyo Co., Ltd., U-CAT3503N and UCAT3502T (product names of block isocyanate compounds of dimethylamine), and DBU, DBN, U-CATSA102, and U-CAT5002 (product names of bicyclic amidine compounds and their salt) produced by San Apro Co., Ltd.

The content of the epoxy catalyst may be about 0.01 to 15 weight % based on the total weight of the photo-sensitive resin composition, and preferably about 0.05 to 10 weight %. When the epoxy catalyst is used below about 0.01 weight %, the epoxy resin is cured insufficiently, and when the catalyst is used over about 15 weight %, there is a problem of poor developing property.

Filler

The filler takes a role of reinforcing heat-resistant, hygroscopic property, dimensional stability, and color. The filler also improves the heat-resistant stability, the dimensional stability to heat, and the adhesive strength of the resin, and acts as a body pigment by reinforcing the color.

As the filler, inorganic or organic fillers may be used, for example barium sulfate, barium titanate, amorphous silica, crystalline silica, fused silica, spherical silica, talc, clay, magnesium carbonate, calcium carbonate, aluminum oxide (alumina), aluminum hydroxide, mica, and the like may be used.

The content of the filler may be about 5 to 50 weight % based on the total weight of the photo-sensitive resin composition, preferably about 10 to 40 weight %, and more preferably about 15 to 35 weight %. When the filler is used over about 50 weight %, it is not preferable because the viscosity of the composition becomes high and the coatability may deteriorate or the curing degree falls down, and when the filler is used below about 5 weight %, there is a problem of poor heat-resistant reliability.

Pigment

The pigment takes a role of hiding the defects such as scratches of the circuit lines by providing visibility and hiding power.

As the pigment, red, blue, green, yellow, and black pigments may be used. As the blue pigment, pigment blue 15:1, pigment blue 15:2, pigment blue 15:3, pigment blue 15:4, pigment blue 15:6, pigment blue 60, and the like may be used. As the green pigment, pigment green 7, pigment green 36, solvent green 3, solvent green 5, solvent green 20, solvent green 28, and the like may be used. As the yellow pigment, anthraquinone-based compounds, isoindolinone-based compounds, condensed azo-based compounds, benzimidazolone-based compounds, and the like may be used, for example, pigment yellow 108, pigment yellow 147, pigment yellow 151, pigment yellow 166, pigment yellow 181, pigment yellow 193, and the like may be used.

The content of the pigment may be about 0.01 to 5 weight % based on the total weight of the photo-sensitive resin composition, and preferably about 0.05 to 3 weight %. When the pigment is used below about 0.01 weight %, the visibility and hiding power fall down, and when the pigment is used over about 5 weight %, the heat-resistant falls down.

Leveling Agent

The leveling agent takes a role of eliminating popping or craters on the surface of the film during coating process.

As the leveling agent, silicone-based compounds, fluorine-based compounds, polymer-based compounds, and the like may be used, for example BYK-380N, BYK-307, BYK-378, BYK-350, and the like produced by BYK-Chemie GmbH may be used.

The content of the leveling agent may be about 0.05 to 10 weight % based on the total weight of the photo-sensitive resin composition, preferably about 0.1 to 5 weight %, and more preferably about 0.15 to 3 weight %. When the leveling agent is used below about 0.05 weight %, it is insufficient to eliminate the popping and craters, and when the leveling agent is used over about 10 weight %, there is a problem of generating many bubbles.

Dispersing Agent

The dispersing agent takes a role of improving disperse stability of filler, pigment, and the like, when they are used.

As the dispersing agent, for example Disperbyk-110, Disperbyk-162, Disperbyk-168, and the like produced by BYK-Chemie GmbH may be used.

The content of the dispersing agent may be about 0.01 to 10 weight % based on the total weight of the photo-sensitive resin composition, preferably about 0.1 to 5 weight %, and more preferably about 0.15 to 3 weight %. When the content of the dispersing agent is below about 0.01 weight %, the dispersion is insufficient, and when the content is over about 10 weight %, the heat-resistant and the reliability may be affected.

Solvent

The solvent takes a role of dissolving the photo-curing components or the thermalcuring components, and controlling the viscosity of the composition suitable for various coating methods.

As the solvent, ketones such as methylethylketone, cyclohexanone, and the like; aromatic hydrocarbons such as toluene, xylene, tetramethylbenzene, and the like; glycol ethers (cellosolves) such as ethyleneglycol monoethylether, ethyleneglycol monomethylether, ethyleneglycol monobutylether, diethyleneglycol monoethylether, diethyleneglycol monomethylether, diethyleneglycol monobutylether, propyleneglycol monomethylether, propyleneglycol monoethylether, dipropyleneglycol diethylether, triethyleneglycol monoethylether, and the like; acetic acid esters such as ethyl acetate, butyl acetate, ethyleneglycol monoethylether acetate, ethyleneglycol monobutylether acetate, diethyleneglycol monoethylether acetate, diethyleneglycol monobutylether acetate, propyleneglycol monomethylether acetate, dipropyleneglycol monomethylether acetate, and the like; alcohols such as ethanol, propanol, ethylene glycol, propylene glycol, carbitol, and the like; aliphatic hydrocarbons such as octane, decane, and the like; petroleum solvents such as petroleum ether, petroleum naphtha, hydrogenated petroleum naphtha, solvent naphtha, and the like; and amides such as dimethyl acetamide, dimethylform amide (DMF), and the like may be used. These solvents may be used solely or by mixing two or more.

The content of the solvent may be about 10 to 50 weight % based on the total weight of the photo-sensitive resin composition, preferably about 12 to 40 weight %, and more preferably about 13 to 35 weight %. When the content of the solvent is below about 10 weight %, the viscosity is too high and the coatability falls down, and when the content is over about 50 weight %, the drying property becomes bad and the stickiness increases.

Meanwhile, according to the other embodiment of the present invention, a protective film for printed circuit board prepared by using the photo-sensitive resin composition is provided.

In the present invention, the process of preparing a dry film solder resist (DFSR) as a protective film for PCB by using the photo-sensitive resin composition is as follows.

Firstly, the photo-sensitive resin composition is coated as a photo-sensitive coating material on a carrier film and dried by passing the film through an oven, and then a release film is laminated thereon so as to prepare a dry film composed of a carrier film, a photo-sensitive film, and a release film sequentially from the bottom. At this time, polyethyleneterephthalate (PET) and the like may be used as the carrier film, and polyethylene (PE) and the like may be used as the release film, however, it is not limited to or by this and any materials well known in the related art may be used. The drying temperature in the oven may preferably be about 70 to 100° C., and the thickness of the photo-sensitive film formed from the photo-sensitive thermosetting resin composition may preferably be about 10 to 40 μm.

The protective film for PCB prepared by said method may have an elongation (%) at break of about 3.4 to 6.2%, represented by the following Equation 1:

$$\text{Elongation at break}(\%) = (L - L_0)/L_0 \times 100 \qquad \text{[Equation 1]}$$

wherein, L is the length of the specimen at break when elongating the specimen of 50 mm length with the tensile speed of 50.8 mm/min, and $L_0$ is the initial length of the specimen.

Meanwhile, the present invention can prepare a printed circuit board by using the dry film prepared above.

Firstly, after peeling away the release film (protective film, PE film) from the prepared dry film, the photo-sensitive film layer is vacuum laminated on a board on which a circuit is formed.

And then, a photo-mask corresponding to a circuit pattern is put on the photo-sensitive film layer and the substrate is exposed to a light. The light source may be a ultra-violet (UV) lay, an electron lay, an X-ray, and the like, and the irradiating conditions follow common methods. At this time, the carrier film may be peeled away before or after the exposure.

After this, when the exposure to the photo-sensitive film layer is finished, a desired pattern is prepared by developing the photo-sensitive film layer for eliminating the unnecessary parts. In developing process after exposure, the film is generally dipped in a developing solution according to a dipping method, and the developing solution may be an aqueous alkali solution such as an aqueous sodium hydroxide solution or an aqueous sodium carbonate solution. At this time, a washing process with water may be comprised after the developing process with the aqueous alkali solution.

Finally, the printed circuit board comprising the protective film (solder resist) is formed from the photo-sensitive film, by thermo-curing the developed pattern in 140 to 160° C. oven for 0.5 to 2 hours, and photo-curing (post cure) the same with a light exposure of 500 to 2,000 mJ/cm$^2$.

The photo-sensitive resin composition of the present invention comprises the butadiene-modified epoxy resin including epoxy group and at least one double bond in the main chain as an essential component, and can improve the heat-resistant and the mechanical property of the protective film for PCB, which is the dry solder resist prepared by using the same, at the same time.

EXAMPLES

Hereinafter, the functions and the effects of the invention are explained in more detail, according to specific examples of the present invention. However, the following examples are only for explaining the present invention and the range of the present invention is not limited to or by them.

Example 1

A photo-sensitive resin composition was prepared by using EPOLEAD PB 3600 of 5 weight % as the butadiene-modified epoxy resin which is an additive for improving the heat-resistant and the mechanical property, CCR-1235 (Nippon Kayaku Co., Ltd.) of 35 weight % as the acid-modified oligomer, DPEA-12 (Kayarad Co., Ltd.) of 10 weight % as the photo-polymerizable monomer, TPO of 4 weight % as the photo-initiator, EOCN-1020 (Nippon Kayaku Co., Ltd.) of 15 weight % as the epoxy resin, dicyandiamide of 0.1 weight % as the epoxy hardener, 2MI of 0.1 weight % as the epoxy catalyst, BaSO$_4$ of 15 weight % as the filler, pigment blue 15:3 of 0.2 weight % and pigment yellow 151 of 0.2 weight % as the pigment, BYK-380N of 0.3 weight % as the leveling agent, Disperbyk-110 of 0.1 weight % as the dispersing agent, and DMF of 15 weight % as the solvent.

A dry film composed of a carrier film, a photo-sensitive film (thickness of 20 μm), and a release film sequentially from the bottom was prepared by coating the prepared photo-sensitive resin composition on a carrier film (PET film), drying the same by passing through an oven of 75° C., and laminating a release film (PE film) thereon.

A printed circuit board including the protective film (solder resist) formed from the photo-sensitive film was prepared by peeling away the cover film from the prepared dry film, vacuum laminating the photo-sensitive film layer on a board on which a circuit is formed, putting a photo-mask corresponding to a circuit pattern on the photo-sensitive film layer and exposing to an UV light, forming a desired pattern by developing the photo-sensitive film layer with an alkali solution for eliminating the unnecessary parts, and photo-curing the same.

Example 2

A dry film and a printed circuit board were prepared substantially according to the same method as in Example 1, except that EPOLEAD PB 3600 of 2 weight % as the additive for improving the heat-resistant and the mechanical property, and DMF of 18 weight % as the solvent were used.

Example 3

A dry film and a printed circuit board were prepared substantially according to the same method as in Example 1, except that EPOLEAD PB 3600 of 10 weight % as the additive for improving the heat-resistant and the mechanical property, and DMF of 10 weight % as the solvent were used.

Example 4

A dry film and a printed circuit board were prepared substantially according to the same method as in Example 1, except that the butadiene-modified epoxy resin (polybutadiene, epoxy functionalized, hydroxy terminated, product No. 387673) (Sigma-Aldrich Co., Ltd.) of 10 weight % as the additive for improving the heat-resistant and the mechanical property, and DMF of 10 weight % as the solvent were used.

Comparative Example 1

A dry film and a printed circuit board were prepared substantially according to the same method as in Example 1, except that the butadiene-modified epoxy resin was not used and DMF of 20 weight % was used as the solvent.

Comparative Example 2

A dry film and a printed circuit board were prepared substantially according to the same method as in Example 1, except that EPOLEAD PB 3600 of 0.5 weight % as the additive for improving the heat-resistant and the mechanical property, and DMF of 19.5 weight % as the solvent were used.

Comparative Example 3

A dry film and a printed circuit board were prepared substantially according to the same method as in Example 1, except that EPOLEAD PB 3600 of 30 weight % as the additive for improving the heat-resistant and the mechanical property, CCR-1235 (Nippon Kayaku Co., Ltd.) of 25 weight % as the acid-modified oligomer, $BaSO_4$ of 5 weight % as the filler, and DMF of 10 weight % as the solvent were used.

Comparative Example 4

A dry film and a printed circuit board were prepared substantially according to the same method as in Example 1, except that NBR1072 of 5 weight % was used as the additive for improving the heat-resistant and the mechanical property.

Comparative Example 5

A dry film and a printed circuit board were prepared substantially according to the same method as in Example 1, except that the butadiene-modified epoxy resin (polybutadiene, hydroxyl terminated, product No. 190799) (Sigma-Aldrich Co., Ltd.) of 5 weight % was used as the additive for improving the heat-resistant and the mechanical property.

Experimental Examples

The heat-resistant and the mechanical property (modulus) were measured to the protective film for PCB prepared in Examples 1-4 and Comparative Examples 1-5, and the results are listed in Table 3.

For measuring the heat-resistant, a coefficient of thermal expansion ($\alpha 1$: thickness direction, $\alpha 2$: thickness direction) was measured by using thermal mechanical analyzer (TMA). TMA/SDTA 840 device of METTLER TOLEDO Co., Ltd. was used as the TMA device, the temperature was elevated with 10° C. per 1 minute from 50° C. to 200° C., and the coefficient of thermal expansion was measured to the length of 10 mm while applying the force of 0.05 N. For measuring the modulus, an elongation was measured by using a universal testing machine (UTM). Z010 device of Zwick Co., Ltd., Germany, was used as the UTM, and the length of specimen at break was measured while elongating the specimen of 50 mm length with the elongation speed of 50.8 mm/min, and the elongation at break was calculated by the following Mathematical Formula 1:

Elongation at break(%)=$(L-L_0)/L_0 \times 100$ [Mathematical Formula 1]

wherein, L is the length of the specimen at break when elongating the specimen of 50 mm length with the tensile speed of 50.8 mm/min, and $L_0$ is the initial length of the specimen.

TABLE 3

| | Tg (° C.) | α1 | α2 | Elongation at break (%) |
|---|---|---|---|---|
| Example 1 | 115 | 50 | 148 | 4.6 |
| Example 2 | 114 | 52 | 150 | 3.4 |
| Example 3 | 110 | 56 | 178 | 5.0 |
| Example 4 | 108 | 58 | 183 | 4.8 |
| Comparative Example 1 | 116 | 47 | 145 | 2.4 |
| Comparative Example 2 | 115 | 49 | 146 | 2.6 |
| Comparative Example 3 | 91 | 70 | 204 | 6.2 |
| Comparative Example 4 | 87 | 65 | 162 | 3.1 |
| Comparative Example 5 | 83 | 60 | 210 | 4.5 |

When the additive for improving the properties is used largely, there is a characteristic of that the mechanical property is largely improved but the heat-resistant falls down. As recognized in table 3, when the content of the additive for the property exceeded the proper amount, the mechanical property got better but the heat-resistant deteriorated, and when the amount was below the proper amount, the heat-resistant was maintained but there was no improvement in the mechanical property.

On the other hand, it can be recognized that the Examples of the present invention are superior in both of the heat-resistant and the mechanical property by using the butadiene-modified epoxy resin including epoxy groups in its main chain and having at least one or more double bonds. It is also recognizable that the heat-resistant and the mechanical property are improved by using the additive with the proper amount of 2 weight %, 5 weight %, and 10 weight %.

What is claimed is:

1. A photo-sensitive resin composition, comprising: an acid-modified oligomer, a photo-polymerizable monomer, a photo-initiator, an epoxy resin and a butadiene-modified epoxy resin having at least three epoxy groups and at least three double bonds in the main chain, wherein the butadiene-modified epoxy resin is the compound represented by Chemical Formula 1 and has an acid value of 1 mgKOH/g or less, and a number average molecular weight of 1,000 to 10,000:

Chemical Formula 1

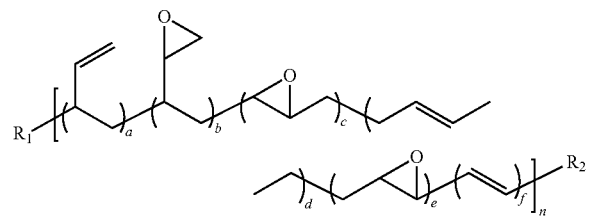

wherein, $R_1$ and $R_2$ are respectively a $C_{1-5}$ alkyl group, a $C_{1-5}$ alkoxy group, cyclopentyl group, cyclohexyl group, a $C_{6-30}$ aryl group, a $C_{6-30}$ alkylaryl group or a halogen atom;

a, b, c, d, e and f are respectively an integer of 1 to 5, and a+b+c+d+e+f is 20 or less; and n is an integer of 1 to 50.

2. A photo-sensitive resin composition, comprising: an acid-modified oligomer, a photo-polymerizable monomer, a photo-initiator, an epoxy resin and a butadiene-modified epoxy resin having at least one epoxy group and at least one double bond in the main chain, wherein the butadiene-modified epoxy resin is the compound represented by the following Chemical Formula 1:

Chemical Formula 1

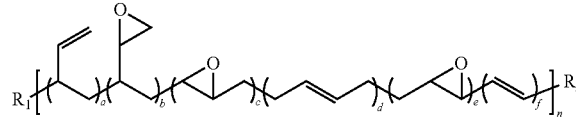

wherein, $R_1$ and $R_2$ are respectively a $C_{1-5}$ alkyl group, a $C_{1-5}$ alkoxy group, cyclopentyl group, cyclohexyl group, a $C_{6-30}$ aryl group, a $C_{6-30}$ alkylaryl group or a halogen atom;

a, b, c, d, e and f are respectively an integer of 0 to 5, and a+b+c+d+e+f is 20 or less, wherein at least one of c and e is not 0, at least one of d and f is not 0; and n is an integer of 1 to 50, wherein said butadiene-modified epoxy resin is

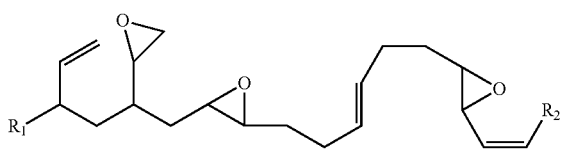

wherein, $R_1$ and $R_2$ are respectively a $C_{1-5}$ alkyl group, a $C_{1-5}$ alkoxy group, cyclopentyl group, cyclohexyl group, a $C_{6-30}$ aryl group, a $C_{6-30}$ alkyl aryl group or a halogen atom.

3. The photo-sensitive resin composition according to claim 1, wherein the butadiene-modified epoxy resin has an epoxy equivalent of 100 to 400.

4. The photo-sensitive resin composition according to claim 1, wherein the content of the butadiene-modified epoxy resin is 1 to 20 weight % based on the total weight of the photo-sensitive resin composition.

5. The photo-sensitive resin composition of claim 4, wherein the content of the butadiene-modified epoxy resin is 1 to 5 weight % based on the total weight of the photo-sensitive resin composition.

6. The photo-sensitive resin composition according to claim 1, wherein the acid-modified oligomer is at least one selected from the compounds obtained by polymerizing a polymerizable monomer having carboxyl groups with methyl methacrylate, methyl acrylate, or ethyl acrylate.

7. The photo-sensitive resin composition according to claim 1, wherein the content of the acid-modified oligomer is 15 to 75 weight % based on the total weight of the photo-sensitive resin composition.

8. The photo-sensitive resin composition according to claim 1, wherein the acid value of the acid-modified oligomer is 40 to 120 mgKOH/g.

9. The photo-sensitive resin composition according to claim 1, wherein the photo-polymerizable monomer is at least one compound selected from the group consisting of acrylates including hydroxyl group, water soluble acrylates, polyester acrylates, polyurethane acrylates, epoxy acrylates and caprolactone-modified acrylates.

10. The photo-sensitive resin composition according to claim 1, wherein the content of the photo-polymerizable monomer is 5 to 30 weight % based on the total weight of the photo-sensitive resin composition.

11. The photo-sensitive resin composition according to claim 1, wherein the photo-initiator is at least one compound selected from the group consisting of benzoin, benzoin methyl ether, benzoin ethyl ether, acetophenone, 2,2-dimethoxy-2-phenyl acetophenone, 2,2-diethoxy-2-phenyl acetophenone, 2-methyl anthraquinone, 2-ethyl anthraquinone and 2,4,6-trimethylbenzoyldiphenyl phosphine oxide.

12. The photo-sensitive resin composition according to claim 1, wherein the content of the photo-initiator is 0.1 to 10 weight % based on the total weight of the photo-sensitive resin composition.

13. The photo-sensitive resin composition according to claim 1, wherein the epoxy resin is at least one compound selected from the group consisting of a bisphenol A epoxy resin, a hydrogenated bisphenol A epoxy resin, a brominated bisphenol A epoxy resin, a bisphenol F epoxy resin, a bisphenol S epoxy resin, a novolak epoxy resin, a phenol novolak epoxy resin, a cresol novolak epoxy resin, N-glycidyl epoxy resin, a novolak epoxy resin of bisphenol A, a bixylenol epoxy resin, a biphenol epoxy resin, a chelate epoxy resin, a glyoxal epoxy resin, an epoxy resin including amino groups, a rubber-modified epoxy resin, a dicyclopentadiene phenolic epoxy resin, diglycidyl phthalate resin, a heterocyclic epoxy resin, a tetraglycidyl xylenoyl ethane resin, a silicone-modified epoxy resin and a ϵ-caprolatone-modified epoxy resin.

14. The photo-sensitive resin composition according to claim 1, wherein the content of the epoxy resin is 5 to 30 weight % based on the total weight of the photo-sensitive resin composition.

15. The photo-sensitive resin composition according to claim 1, wherein the composition further includes at least one selected from the group consisting of an epoxy hardener, an epoxy catalyst, a filler, a pigment, a leveling agent, a dispersing agent and a solvent.

16. A protective film obtained by photocuring the photo-sensitive resin composition of claim 1 and having elongation at break of 3.4 to 5.0%, wherein elongation at break (%)=(L−$L_0$)/$L_0$×100, wherein L is the length of the film at break when elongating the film of 50 mm length with tensile speed of 50.8 mm/min, and $L_0$ is the initial length of the film.

17. A photo-sensitive resin composition, comprising: an acid-modified oligomer, a photo-polymerizable monomer, a photo-initiator, an epoxy resin and a butadiene-modified epoxy resin having at least three epoxy groups and at least three double bonds in the main chain, wherein the butadiene-modified epoxy resin is the compound represented by Chemical Formula 1 and has an acid value of 1 mgKOH/g or less, and a number average molecular weight of 1,000 to 10,000:

Chemical Formula 1

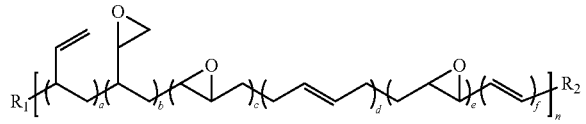

wherein, $R_1$ and $R_2$ are respectively a $C_{1-5}$ alkyl group, a $C_{1-5}$ alkoxy group, cyclopentyl group, cyclohexyl group, a $C_{6-30}$ aryl group, a $C_{6-30}$ alkylaryl group or a halogen atom;

a, b, c, d, e and f are respectively an integer of 0 to 5, and a+b+c+d+e+f is 20 or less, wherein at least one of c and e is not 0, at least one of d and f is not 0; and n is an integer of 1 to 50, and wherein the content of the butadiene-modified epoxy resin is 1 to 5 weight % based on the total weight of the photo-sensitive resin composition.

* * * * *